United States Patent [19]
Schlager et al.

[11] Patent Number: 6,157,561
[45] Date of Patent: Dec. 5, 2000

[54] INTEGRATED CIRCUIT MEMORY WITH LOW RESISTANCE, SEGMENTED POWER SUPPLY LINES

[75] Inventors: Tobias Schlager, Graz, Austria; Georg Braun, Munich, Germany; Heinz Hoenigschmid, Starnberg, Germany; Thomas Boehm, Zorneding, Germany

[73] Assignee: Infineon Technologies AG, Munich, Germany

[21] Appl. No.: 09/513,587

[22] Filed: Feb. 25, 2000

[30] Foreign Application Priority Data

Feb. 25, 1999 [DE] Germany .................. 199 8 205

[51] Int. Cl.⁷ .................................................. G11C 5/06
[52] U.S. Cl. .......................... 365/63; 365/51; 365/226; 365/230.06
[58] Field of Search ................... 365/63, 72, 51, 365/226, 230.06

[56] References Cited

U.S. PATENT DOCUMENTS

| | | | |
|---|---|---|---|
| 4,658,377 | 4/1987 | McElroy | 365/149 |
| 5,808,930 | 9/1998 | Wada et al. | 365/63 |
| 5,815,457 | 9/1998 | Pascucci | 365/230.06 |
| 5,936,875 | 8/1999 | Kim et al. | 365/51 |
| 5,940,315 | 8/1999 | Cowles | 365/51 |
| 5,973,953 | 10/1999 | Yamashita et al. | 365/63 |
| 5,995,405 | 11/1999 | Trick | 365/63 |

*Primary Examiner*—Andrew Q. Tran
*Attorney, Agent, or Firm*—Herbert L. Lerner; Laurence A. Greenberg; Werner H. Stemer

[57] ABSTRACT

An integrated memory having a first wiring plane with parallel conductor tracks running therein. A second wiring plane in the memory has segments running in it that are parallel to the conductor tracks. Word lines are each formed by a conductor track of a first type and by segments configured parallel to this conductor track. A conductor track of a second type is connected to a first supply line and to regions that are configured in a third wiring plane within the cell array.

6 Claims, 4 Drawing Sheets

INTEGRATED CIRCUIT MEMORY WITH LOW RESISTANCE, SEGMENTED POWER SUPPLY LINES

BACKGROUND OF THE INVENTION

Field of the Invention

The invention relates, in general, to an integrated memory and, in particular, to a memory cell array with a configuration of supply lines having a low resistance.

Integrated memories, such as DRAMs (Dynamic Random Access Memories), generally have a multiplicity of memory cells which are configured at crossing points or adjacent regions of overlap of word lines and bit lines. The word lines are each configured parallel to one another and are at regular distances from one another. The bit lines are each configured parallel to one another and are at regular distances from one another. The configuration of memory cells along the word lines and bit lines is called a memory cell array. It is often necessary to supply particular potentials and signals to regions within the cell array. These potentials can be supplied by lines running outside the cell array and parallel to one of the edges of the cell array. These lines branch off toward the inside of the cell array where they are connected to the regions that are to be supplied with the respective potential. This produces the following problem: as the extent of the cell array increases (its extent increases with higher storage capacities), the potentially poorly conductive branch lines within the cell array increase in length. The branch lines are necessary for conveying the potentials and branch off from the (main) supply lines routed along the cell array. The result of the increasing line lengths is an increased line resistance, which makes the potentials that are to be supplied susceptible to faults caused by fluctuations in the supply potential, for example.

It would therefore be desirable to route the main supply lines necessary for supplying the potentials to the regions that are to be supplied not only at the periphery of the cell array but also in the center of the cell array. This would either eliminate the poorly conductive branch lines described or would keep them as short as possible. A conflicting consideration, however, is the fact that the structures forming the bit lines and word lines and the structures forming the memory cells that are configured at the crossing points of the word and bit lines should be configured as regularly as possible in order to achieve the best production process. In addition, producing memory cell arrays which are as compact as possible requires minimizing the distances between the word lines and the distances between the bit lines. Therefore, it is not possible, without using further wiring planes, to route the supply lines in the center of the memory cell array without interrupting the regular structure of the word and bit lines at these points.

SUMMARY OF THE INVENTION

It is accordingly an object of the invention to provide an integrated memory of the type described whose manufacture benefits from the regular configuration of the structures forming the word lines, bit lines, and memory cells, and in which, despite this, particular potentials are supplied in the center of the cell array in a way which keeps the resistance of corresponding supply lines as low as possible without additional wiring planes.

With the foregoing and other objects in view there is provided, in accordance with the invention, an integrated memory having memory cells which are configured in a memory cell array at crossing points or adjacent regions of overlap of bit Lines and word lines. Each memory cell has a selection transistor that connects the memory cell to one of the bit lines and has a control connection that is connected to one of the word lines. It also has a word line decoder with outputs which are each connected to one of the word lines, and a first supply line for a first potential. The memory has conductor tracks that are configured regularly within the cell array in a first wiring plane and run parallel to one another and the memory has segments that are configured regularly in a second wiring plane. A plurality of the segments are configured parallel to each conductor track in each case. The segments are connected to respective control connections of the selection transistors of a multiplicity of the memory cells. The conductor tracks are subdivided into a multiplicity of conductor tracks of a first type and at least one conductor track of a second type. The word lines are each formed by one of the conductor tracks of the first type and by the segments configured parallel to this conductor track. Each conductor track of the first type is connected to one of the outputs of the word line decoder and to the segments configured parallel to it. The conductor track of the second type is connected to the first supply line and to a region which is configured in a third wiring plane within the cell array.

In accordance with an added feature of the invention, both the conductor track of the second type, which is used for supplying the region configured in the third wiring plane with the first potential, and the word lines have, as a component part of them, the conductor tracks which are configured regularly and run parallel to one another. This allows the construction of a regular cell array using a manufacturing process that is relatively trouble-free. In conventional memories, each of the conductor tracks would be a component part of one of the word lines. In the memory according to the invention, the conductor tracks of the second type are not a component part of a word line, however, but are used to convey the first potential to the region that is to be supplied with the potential.

In accordance with an additional feature of the invention, the region that is configured in the third wiring plane may be, for example, a doped well configured in a substrate of the integrated memory. If the memory cells in the memory have one storage capacitor each, as is the case with DRAMs, for example, the region which is configured in the third wiring plane can also be a cell plate connected to one of the electrodes of each of the storage capacitors.

In accordance with a further feature of the invention, the integrated memory has a second supply line for supplying a second potential which, when applied to the control connection of one of the selection transistors, turns off the transistor. One of the conductor tracks, which is configured adjacent to the conductor track of the second type, is a conductor track of a third type, which is connected to the second supply line and to the segments configured parallel to it. The segments connected to the conductor track of the third type are connected in the second wiring plane to those segments which are configured parallel to the conductor track of the second type.

This feature provides the advantage that the segments configured parallel to the conductor track of the second type are also supplied with the second potential. This enables the selection transistors connected to them to be constantly turned off and the associated memory cells do not affect the potential on the bit lines that are connected to them.

Other features which are considered as characteristic for the invention are set forth in the appended claims.

Although the invention is illustrated and described herein as embodied in an integrated memory, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
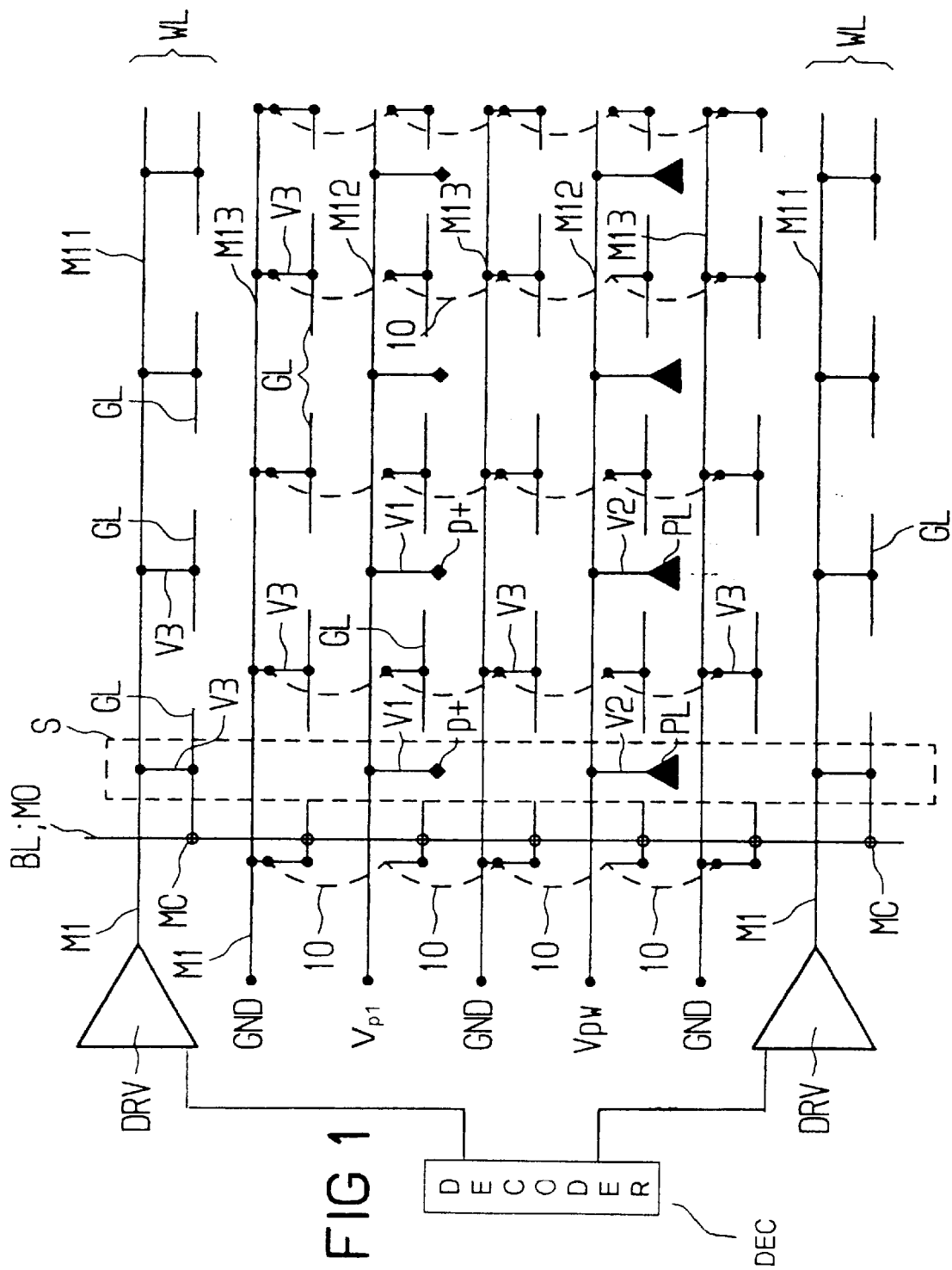
FIG. 1 shows a basic illustration of the memory cell array of the integrated memory according to the invention.

Referring now to the figures of the drawing in detail and first, particularly, to FIG. 1 thereof, there is shown a detail of a memory cell array in a DRAM-type integrated memory according to the invention. The memory cells MC are configured at crossing points or regions of overlap of bit lines BL and word lines WL. FIG. 1 shows only one of the bit lines BL as a detail. In reality, the memory has a multiplicity of these bit lines BL, configured parallel to one another in each case. The bit lines BL run in a first metalization plane M0 of the memory. FIG. 1 shows only two of the word lines WL, namely at the top and bottom edges of the figure. In reality, the memory has a large number of further word lines, which each run horizontally and are configured at the top and bottom adjacent to the two word lines WL shown in FIG. 1. FIG. 1 shows only the memory cells MC configured along the single illustrated bit line BL and these memory cells are shown as circles.

Figure 6:
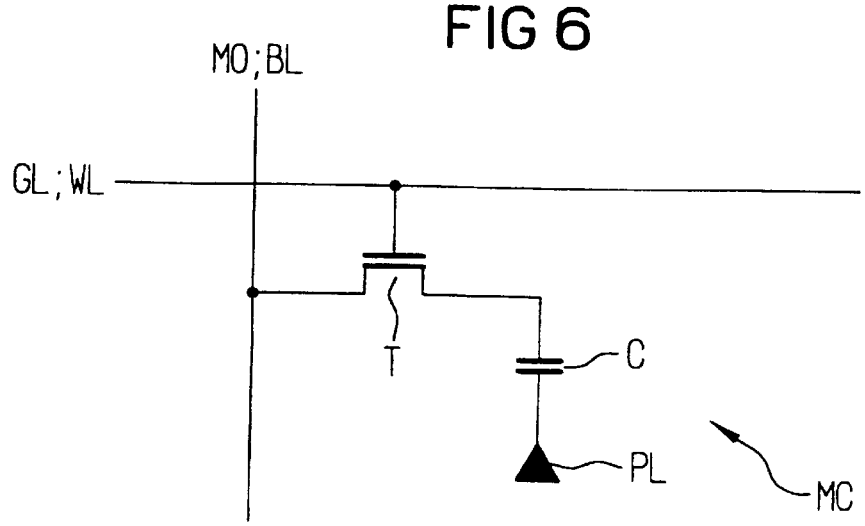
FIG. 6 shows a memory cell from the memory shown in the preceding figures.

The memory cells MC are designed in the form of a DRAM 1-transistor/1-capacitor memory cell, as shown in FIG. 6. They each have a selection transistor T and a storage capacitor C. One end of the storage capacitor C is connected to a cell plate PL and its other end is connected to the associated bit line BL via the selection transistor T. The gate of the selection transistor T is connected to an associated word line WL. Whereas the bit lines BL, as already mentioned, run in the first metalization plane M0, the word lines WL have, as a component part, gate lines in the form of segments GL configured in a polysilicon plane of the memory which runs below the first metalization plane M0.

FIG. 1 shows that the word lines WL each have a conductor track of a first type M11, configured in a second metalization plane M1, and a plurality of the segments GL which are configured in the polysilicon plane. The segments GL are connected to the associated conductor track of the first type M11 by means of a respective contact point V3. The memory cells MC are configured along the segments GL, that is to say that a multiplicity of the bit lines BL intersect each segment GL. The conductor tracks of the first type M11 are each connected to an output DRV of a word line decoder DEC. The word line decoder DEC, or its outputs DRV, can be used to address just one of the word lines WL at any instant. The design of the word lines WL (which has been described above) with a main word line and a plurality of word line segments connected to the latter is known generally and is also called the "stitched word line" or "segmented word line".

The memory according to the invention thus has a multiplicity of parallel conductor tracks M11, M12, M13 in the second metalization plane M1 which are each allocated segments GL in the polysilicon plane which have the memory cells MC connected to them. Unlike conventional memories, the conductor tracks include not only those of the first type M11 but also those of a second type M12 and of a third type M13, which are not a component part of one of the word lines WL. The conductor tracks of the second type M12 are connected, by means of appropriate contact points V1 and V2, not to the segments GL in the polysilicon plane which are situated below them and configured parallel to them but to regions configured in another plane. In the case of the top conductor track of the second type M12 in FIG. 1, these regions are p-doped wells p$^+$ with which contact is made by means of contact points V1. In the case of the bottom conductor track of the second type M12 in FIG. 1, this region is a cell plate PL with which contact is made at a plurality of points by means of contact points V2. It is, of course, also possible for the memory to have only one or more than two of the conductor tracks of the second type M12.

The top conductor track of the second type M12 in FIG. 1 is connected to a first supply line $V_{PW}$ (not shown in more detail), which supplies the doped well p$^+$ with an appropriate supply potential. That conductor track of the second type M12 which is shown at the bottom in FIG. 1 is connected to a further supply line $V_{PL}$ (not shown in more detail), which is used to supply the cell plate PL with a cell plate potential whose value depends on the type of memory. In FIG. 1, the connection to the doped wells p$^+$ is shown by a rhombus and the connection to the cell plate PL is shown by a triangle.

The conductor tracks of the third type M13 which are shown in FIG. 1 are configured between one of the conductor tracks of the first type M11 and a conductor track of the second type M12, respectively. The conductor tracks of the third type M13 are connected to a ground supply line GND (not shown in more detail in FIG. 1). They are connected, by means of an appropriate contact point V3, to the segments GL configured parallel to them in the polysilicon plane. Since the conductor tracks of the third type M13 are at ground potential while the memory is operating, all the selection transistors T connected to the corresponding segments GL are turned off. The memory cells MC connected to these selection transistors T therefore do not affect the potential on the associated bit line BL.

The function of the conductor tracks of the third type M13 is as follows. The conductor tracks of the second type M12 are, as explained, connected to the doped well p$^+$ or to the cell plate PL and not to the segments GL configured parallel to them in the polysilicon plane. This can be seen in FIG. 1, which shows no connection between the conductor tracks of the second type M12 and the corresponding segments GL. Since the memory cells connected to these segments GL could have an undesirable effect on the potential on the bit lines BL if their potential were to float, the illustrative embodiment shown here provides for the potential of these segments GL to be the same as ground potential GND. This is achieved by connecting the segments GL in the polysilicon plane which are associated with the conductor tracks of the third type M13 to the segments GL which are associated with the conductor tracks of the second type M12. This means that the ground potential GND is also applied, via the conductor tracks of the third type M13 and their segments GL, to the segments GL which are configured parallel to the conductor tracks of the second type M12. Consequently, the memory cells MC connected to the latter are permanently decoupled from the bit lines BL which are connected to them, since their selection transistors T are permanently off. The connection, produced in the polysilicon plane, between the segments GL associated with the conductor tracks of the second M12 and of the third M13 type is denoted by a dashed curve which is identified by the reference numeral 10 in FIG. 1.

Figure 2:
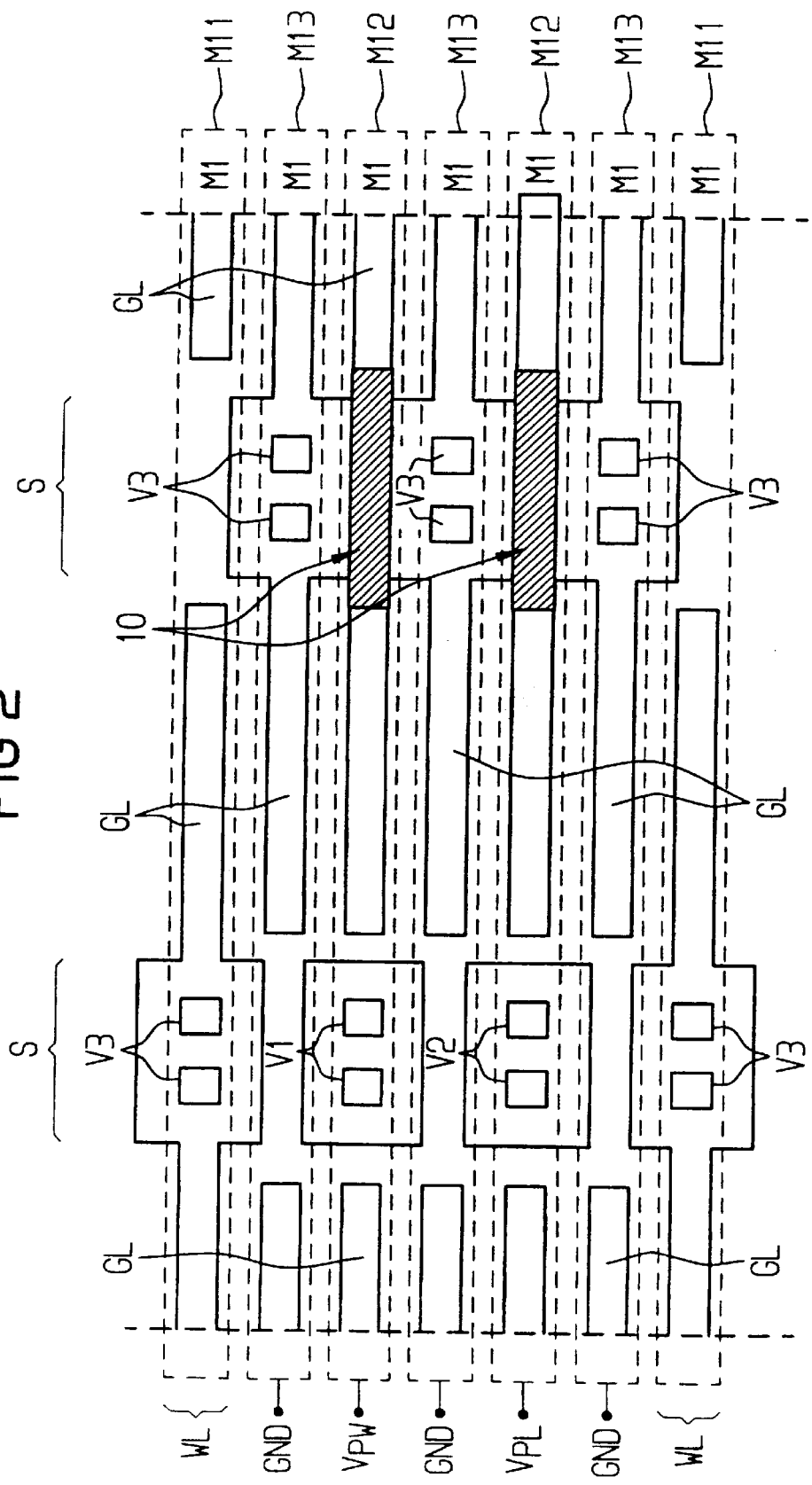
FIG. 2 shows a plan view layout illustration of the integrated memory from FIG. 1.

To enable better understanding, FIG. 2 once again shows a plan view of a layout illustration of the memory cell array shown in part in FIG. 1. The conductor tracks M11, M12, M13 configured in the second metalization plane M1 are shown in dashes. The polysilicon plane situated below the second metalization plane M1 contains the segments GL. FIG. 2 also shows the various contact points V1, V2, V3 used to connect the conductor tracks M11, M12, M13 to the respective regions with which contact is to be made. FIG. 2 also shows the polysilicon regions 10 connecting together the segments GL associated with the conductor tracks of the second type M12 and of the third type M13.

Figure 3:
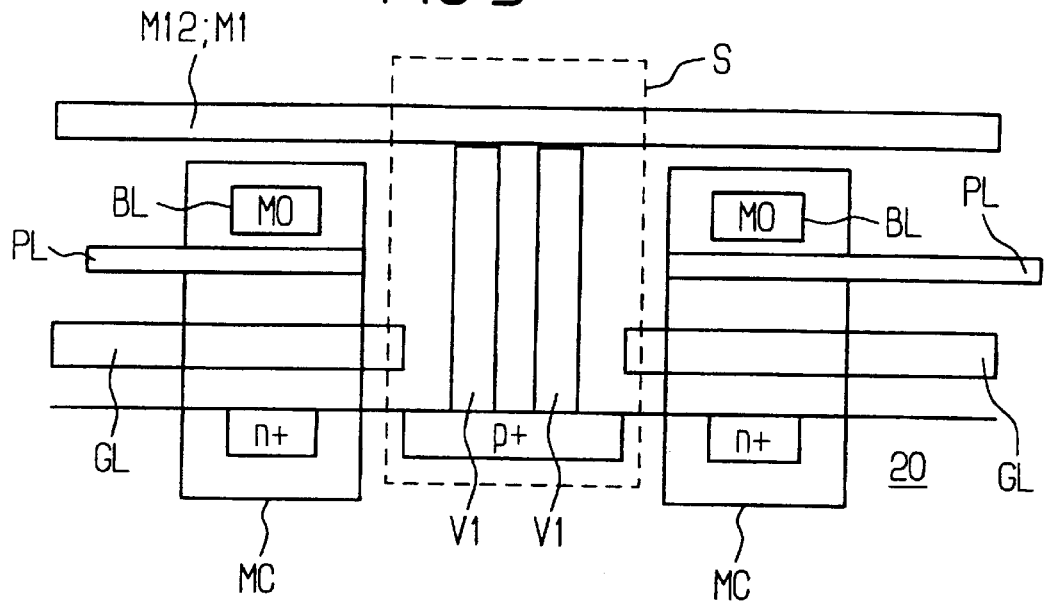
FIGS. 3 to 5 show cross-sectional illustrations of the memory shown in FIG. 2 at various contact points.
Figure 4:
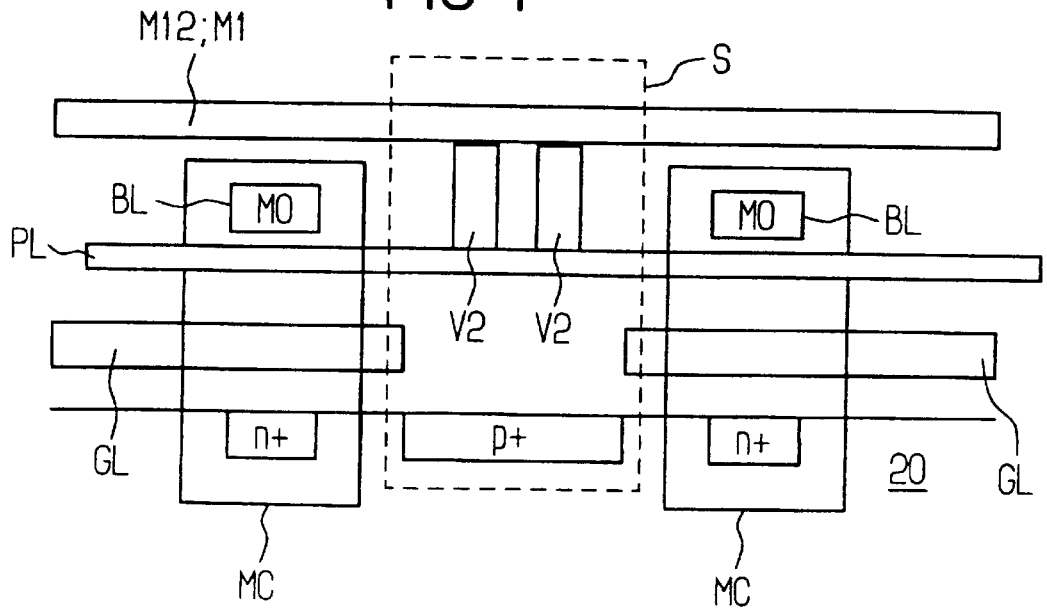
Figure 5:
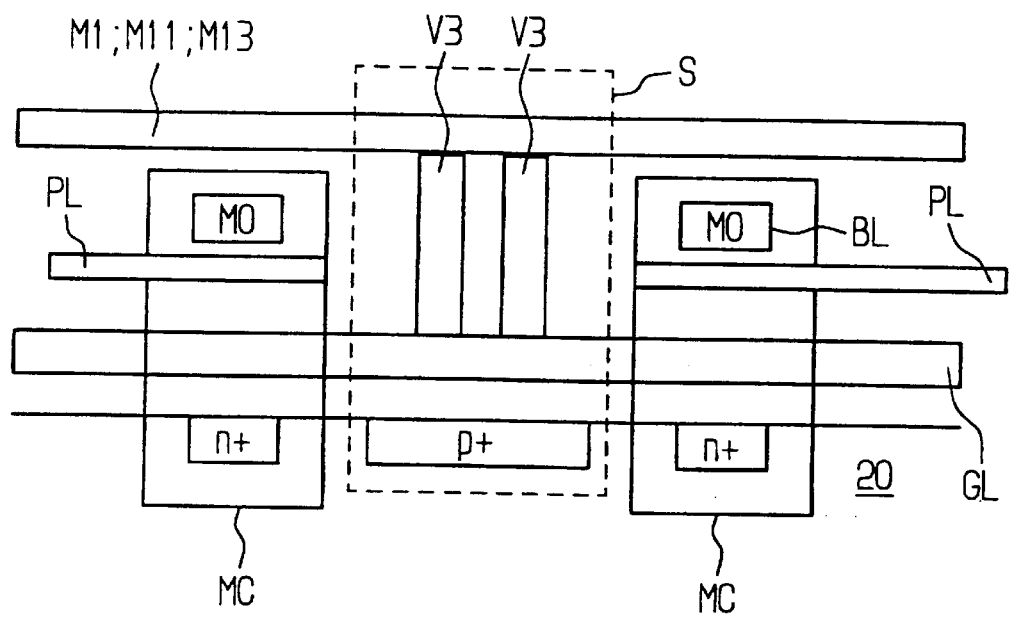

FIGS. 3 to 5 show sectional illustrations along horizontal lines in FIG. 2. FIG. 3 shows a section through one of the first contact points V1 connecting the top conductor track of the second type M12 in FIG. 1 and FIG. 2 to the doped well $p^+$ situated below it. FIG. 3 shows the conductor track of the second type M12 in the second metalization plane M1. The bit lines BL run perpendicularly to this in the first metalization plane M0, which is situated below the second metalization plane M1. The conductive planes or wiring planes described here are each isolated from one another by insulating layers, which are not shown in more detail in the figures. The cell plate PL, which is made of polysilicon, runs below the first metalization plane M0. A plane which is situated below this contains the polysilicon plane of the segments GL. Below the segments GL, there is a substrate 20 made of a semiconductor material, on which the planes described above have been produced. The substrate 20 contains one of the doped wells $p^+$ and two n-doped regions $n^+$, which are component parts of the selection transistor T in each of the memory cells MC. The substrate 20 is n-doped, for example.

The first contact points V1 connect the conductor track of the second type M12 to a multiplicity of the doped wells $p^+$ situated in the substrate 20.

FIG. 4 shows the connection between the conductor track of the second type M12 shown at the bottom in FIG. 1 and FIG. 2, which is used for supplying the cell plate potential $V_{PL}$, and the cell plate PL via the second contact point V2.

FIGS. 3 and 4 show that the conductor tracks of the second type M12 are not connected to the polysilicon segments GL which are configured below them.

FIG. 5 shows one of the third contact points V3, which connect the conductor tracks of the first type M11 and of the third type M13 to the segments GL situated below. Since FIGS. 4 and 5 essentially show the same structures as FIG. 3, this is not explained again.

FIGS. 1 and 2 show that the contact points V1, V2, V3 are configured in a regular grid within the cell array. They are configured above one another along strips S, the so-called "word-line gap". The word-line gap S is shown in each of FIGS. 1 to 5.

In this illustrative embodiment, the material for the contact points V1, V2, V3 is tungsten, as is that for the first metalization plane M0 and the second metalization plane M1.

We claim:

1. An integrated memory, comprising:

a memory cell array having a first wiring plane, a second wiring plane, a third wiring plane, a plurality of bit lines, a plurality of word lines, and a plurality of memory cells, each one of said plurality of memory cells having a selection transistor with a control terminal, each one of said plurality of memory cells connected to a respective one of said plurality of bit lines through its selection transistor, each one of said plurality of memory cells connected to a respective one of said plurality of word lines through said control terminal of its selection transistor;

a word line decoder having a plurality of outputs, each one of said plurality of outputs connected to a respective one of said plurality of word lines;

a first supply line for supplying a first potential;

a region configured in said third wiring plane;

a plurality of parallel conductor tracks configured in said first wiring plane, said plurality of parallel conductor tracks including a plurality of conductor tracks of a first type and at least one conductor track of a second type; and a plurality of segments configured in said second wiring plane and parallel to said plurality of parallel conductor tracks, each one of said plurality of segments connected to said control terminal of a respective one of said plurality of memory cells;

each one of said plurality of word lines formed by one of said plurality of conductor tracks of the first type and by a group of said plurality of segments, said one of said plurality of conductor tracks of the first type connected to said group of said plurality of segments, each one of said plurality of conductor tracks of the first type connected to a respective one of said plurality of outputs of said decoder;

said conductor track of the second type connected to said first supply line and to said region configured in said third wiring plane.

2. The integrated memory according to claim 1, comprising:

a second supply line for supplying a second potential to said selection transistor of at least one of said plurality of memory cells to turn off said selection transistor;

said group of said plurality of segments defining a first group of said plurality of segments; and said plurality of parallel conductor tracks including a conductor track of a third type connected to said second supply line and to a second group of said plurality of segments, said second group of said plurality of segments and said first group of said plurality of segments connected together in said second wiring plane, said conductor track of the third type disposed adjacent at least one of said plurality of conductor tracks of the second type.

3. The integrated memory according to claim 2, comprising contact points disposed regularly in said memory cell array to connect said plurality of conductor tracks of the first type in said first wiring plane to said first group of said plurality of segments in said second wiring plane and to connect said conductor track of the third type in said first wiring plane to said second group of said plurality of segments in said second wiring plane.

4. The integrated memory according to claim 3, comprising at least one additional contact point to connect said at least one conductor track of the second type in said first wiring plane to said region configured in said third wiring plane.

5. The integrated memory according to claim 1, comprising a substrate, and wherein said region configured in said third wiring plane is a doped well disposed in said substrate.

6. The integrated memory according to claim 1, wherein:
each one of said plurality of memory cells includes a storage capacitor with an electrode; and
said region configured in said third wiring plane is a cell plate connected to said electrode of said storage capacitor of each one of said plurality of memory cells.

* * * * *